United States Patent
Kenney

[19]

[11] Patent Number: 5,924,623
[45] Date of Patent: Jul. 20, 1999

[54] DIFFUSION PATTERNED C4 BUMP PADS

[75] Inventor: Christopher S. Kenney, Cedarville, Ill.

[73] Assignee: Honeywell Inc., Minneapolis, Minn.

[21] Appl. No.: 08/885,480

[22] Filed: Jun. 30, 1997

[51] Int. Cl.[6] .............................. B23K 31/02; B23K 1/20
[52] U.S. Cl. .................... 228/180.22; 228/254; 427/271; 427/337
[58] Field of Search .................................. 427/337, 271; 228/254, 180.22

[56] References Cited

U.S. PATENT DOCUMENTS

| | | | |
|---|---|---|---|
| 3,976,524 | 8/1976 | Feng | 427/271 |
| 4,081,901 | 4/1978 | Miller | 228/254 |
| 4,104,422 | 8/1978 | Sandfort | 427/271 |
| 5,492,266 | 2/1996 | Hoebener | 228/248 |
| 5,493,075 | 2/1996 | Chong | 174/261 |
| 5,535,936 | 7/1996 | Chong | 228/175 |

FOREIGN PATENT DOCUMENTS

| | | | |
|---|---|---|---|
| 3305952 | 8/1984 | Germany | 228/180.22 |

OTHER PUBLICATIONS

"Self–Limited C4 Process," *IBM Tech. Discl. Bull.*, vol. 36, No. 10, Oct. 1993, pp. 265–266.

*Primary Examiner*—Patrick Ryan
*Assistant Examiner*—Jeffrey T. Knapp
*Attorney, Agent, or Firm*—John G. Shudy; Roland W. Norris

[57] ABSTRACT

A development process of C4 bump pads is for advanced microelectronic integrated circuit connection technology. This approach involves the laying down of conductor lines on a substrate and an encapsulation over the lines, plus the making of openings for making the bump pads. The bump pads are for situating solder balls for connections with a flip chip or integrated circuit. The openings are made by application of a diffusing material that is patterned on the glass encapsulation to define the areas of the bump pads. After the material is dried and diffused into the encapsulation layer, the diffused material is washed out with water to leave open areas for the bump pads. Then solder balls may be placed on the bump pads and heated to adhere to the conductor lines and form rounded bumps on the respective pads. Flux may then be applied to the solder bumps, and the flip chip is placed with its terminals on the solder bumps which are heated for connection.

19 Claims, 4 Drawing Sheets

SECTION A-A

*SECTION A-A*

DIFFUSION PATTERNED C4 BUMP PADS

BACKGROUND OF THE INVENTION

The present invention pertains to connecting integrated circuits (i.e., "chips") to a substrate for thick film hybrid circuits. It particularly pertains to C4 bump pads for connecting integrated circuits; and, more particularly, the invention pertains to a technique for easier and more reliable laying down solder of bumps on substrate conductors.

C4 is an advanced microelectronic integrated circuit packaging and connection technology. "C4" stands for "Controlled Collapse Chip Connection." C4 relates to the interrelation of "solder bumps" and "flip chips".

The basic idea of C4 is to connect integrated circuits, integrated circuit packages, or other such units to conductor strips or other like connections on substrates or integrated circuits by means of solder bumps partially flattened between two surfaces of the units. The tiny C4 bumps of electrically conductive solder may be arrayed on the surface of one unit and are pressed against metal pads on another unit to make one electrical connection at each solder ball. C4 allows all the connections to be simultaneously made in one step during a reflow operation.

A major application of C4 is in joining semiconductor microchips (integrated circuits) to integrated circuit packages or substrates. The integrated circuits typically are made in repeating rectangular arrays on a mono-crystalline disc of silicon, several inches (or centimeters) across, called a "wafer." Many integrated circuits are formed on each wafer before the integrated circuits are separated into single units. C4 bumps are placed on the metal terminals on the integrated circuits while they are still part of the wafer. Wafers are made as large as possible so as to make the most integrated circuits at once, and the integrated circuits are made as small as possible. The best C4 fabrication system is one that makes very small, closely-spaced solder bumps each precisely placed over a large area. Then the respective integrated circuits may be cut from and isolated from the larger wafer.

C4 is commercially important because it allows a very high density of electrical interconnections. C4 can be used with perimeter connection techniques, similar to tape automated bonding (TAB), but C4 connections can also be arrayed over surfaces. When an area is covered, the number of possible connections for a given size of a unit is roughly squared. C4 bumps are typically about a hundred microns in diameter and the connector density is on the order of several thousand per square inch (6.45 square centimeters).

C4 solder bumps must be and are rugged. A computer or other electronic devices, with dozens of integrated circuits and thousands of C4 solder bump connections, easily can be rendered nonfunctional if only one of the C4 bump connection fails.

One method of fabricating the C4 solder bumps on integrated circuits is by evaporation or vacuum deposition. In this process, terminal metals are first evaporated in a vacuum chamber and these metals are deposited on a wafer through a metal mask. This is followed by evaporation of solder metal, which is deposited through the metal mask on top of the terminal metals. The terminal metals form the ball limiting metallurgy (BLM) and the solder metals constitute the solder bumps.

As shown in FIG. 1, a C4 solder ball 10 (shown as a cross section) is deposited on a metal conductive pad or strip 12 situated on a surface 16 of wafer or substrate 14. The substrate might be polyimide, silicon (Si), quartz ($SiO_2$), ceramic, beryllium oxide (BeO) or other material. In place of the substrate may be a printed circuit board of appropriate material. Ball 10, approximately ranging between 100 and 200 microns in diameter, is preferably composed of about 97 percent lead (Pb) and 3 percent tin (Sn). Pad or strip 12 may have a composition of one part palladium and two parts silver. Other compositions may be used. The solder may be electro-deposited in the form of a cylinder, and subsequently reflowed into bumps.

While adhesion pulls the molten solder drop outward, an opposing force of cohesion pulls it inward. Cohesion is the molecular attraction of a substance to itself. In a liquid it causes surface tension. The surface tension in the molten solder drop tries to reduce the drop's surface area and make it spherical. If the solder does not wet the conductive pad, layer or strip 12 at all, the solder will ball up into an almost-perfect sphere and barely touch the surface. The force of gravity is negligible for such small droplets because the surface area-to-volume ratio is inversely related to diameter. If the two forces of adhesion and cohesion are equal, the drop will take on the hemispherical shape shown by soap bubbles on a soapy table, where surface tension pulls equally in and out.

FIG. 2 is a schematic partial cross section of a flip chip 18 attached to the top of a chip carrier substrate 14. A grid array of C4 solder joints 10 mechanically and electrically connect between an array of metal contacts 20 on flip-chip 18 and a mirror image array of metal contacts 12 on top side 16 of substrate 14.

The related art design involves performing a flip chip 18 attachment on a thick film hybrid circuit of substrate 14 using the C4 solder bump process. This process requires the hybrid circuit design to include C4 solder pads 12 that match the flip chip die 18 solder pads 20. Solder pads 12 and 20 must maintain specific dimensions (i.e., 8 to 11 mils or 200 to 280 microns in diameter) in order for the C4 process to be properly accomplished. Solder pads that are too large may result in solder from the pad causing a short to an unpassivated edge on die 18. Solder pads that are too small may cause die placement problems as well as reliability problems for the resultant circuit. C4 pads 12 consist of a thick film conductor material 11 that has been passivated by a dielectric or encapsulant 22 with an opening in it to create a pad 12. The screen printed encapsulant material is designed to flow and close pin holes or slits caused by the printing processes. This property of the encapsulant material inhibits the forming of small C4 pad openings over the conductor material. To minimize the problems with the encapsulant flow, the C4 pads are located on the circuit by creating a series of square pads out of conductor and glass encapsulant (see FIG. 3).

FIG. 3 reveals the related art C4 solder pad design. By applying an encapsulant 22 with a rectangular opening 24, the ends are allowed to flow while the area that creates C4 pads 12 is monitored. This reduces the problem of encapsulant flowing, but does not eliminate it. These square pads 12 are designed to be aligned with octagonal pads 20 on flip chip 18. When solder is applied to pads 20 on flip chip 18, they take on a round shape. The solder on the thick film circuit has a square shape at the base and a round shape at the top. Proper registration of the bumps relative to one another, as well as size, is critical so that the die can be positioned properly during the C4 bump reflow process.

SUMMARY OF THE INVENTION

The present invention pertains to the using of a diffusion patterning encapsulant to create a C4 bump pad on thick film hybrid circuits. This invention has particular relevance to the production of automotive and commercial solid state sensors.

Currently, the size of the pads and their location are determined by two thick film printing processes for conductors 11 and glass encapsulant 22. The conductors are printed first and the width of the lines for the C4 solder pads are measured and preferably maintained between 8 and 11 mils (200 and 280 microns). The extent of this dimension may range from 5 to 15 mils (125 to 380 microns). FIG. 4 illustrates the conductor 11 and encapsulant 22 components for C4 solder pads 12.

The next step is the applying of a glass encapsulant layer 22. The encapsulant is applied with a rectangular opening or window 24 that creates a solder pad 12 on conductor 11 (see FIG. 4). The window should also be held dimensionally between 8 and 11 mils (200 and 280 microns). The extent of this dimension may range from 5 to 15 mils (200 to 280 microns). Holding these dimensions is very difficult since encapsulant material 22 was designed to flow and close small openings. The combination of these two layers (i.e., conductor 11 and encapsulant 22 layers) creates square solder pads 12 for the C4 bumps 10.

This design relies on controlling two processes which occur at different times with different materials. That is, one has to control the width of conductor strips 11 and control the width of the slits or openings 24 of glass 22 encapsulated over conductors 11 to be soldered, so as to create a specified diameter for a solder bump 10. Skewed distributions can create solder pads that are rectangular in shape if a conductor 11 print is narrow and an encapsulant 22 print is wide or vice versa.

The answer to this problem is noted in the following description. Instead of relying on two materials and processes that are combined to create the C4 solder pads, one replaces them with a diffusion patterning encapsulant material that is capable of creating an opening between 8 and 11 mils (200 and 280 microns). The first step of printing the conductor 11 material remains the same except that the line width for the C4 pad is not required to be held to a specific dimension. Conductor 11 can be designed at least fifty percent larger than is required for C4 pad 12. Once the conductor 11 material is in place, a diffusion patterning encapsulant 22 is applied to the circuit. Encapsulant 22 is a continuous glass layer covering the entire circuit. Once the material is dried at about 150 degrees Centigrade, a patterning material 26 is screen printed onto encapsulant 22. The screen mask for this layer has a round shape for the C4 pads, and provides for their locations and approximate sizes. Once patterning material 26 is applied, the circuit passes through a dryer and material 26 diffuses into encapsulant 22. After the drying/diffusing process, the resultant diffused portion is water soluble. That portion is rinsed with water and the diffused material washes away. The final step is to fire the remaining encapsulant at approximately 525 degrees centigrade. What remains on the circuit is an encapsulant with C4 pads 12 having openings between 8 and 11 mils (200 and 280 microns) in diameter. The diffusion process of the present invention enables one to precisely and accurately make an opening or hole having a desired dimension. FIG. 5A shows diffusion patterning designed C4 solder pads 12 with conductors 11, encapsulant 22 and patterning 26 components. FIG. 5B is a cross-sectional view of FIG. 5A.

The only layer that requires dimensional process control is patterning layer 26 versus controlling dimensions for both the conductor 11 and encapsulant 22 layers of the old process. Encapsulant 22 creates passivation for all sides of the C4 pad and the round shape of C4 pad 12. This process creates a better match to flip chip 18 pads 20 than did the square pads from the old conductor/encapsulant process.

DESCRIPTION OF THE EMBODIMENT

Figure 1:
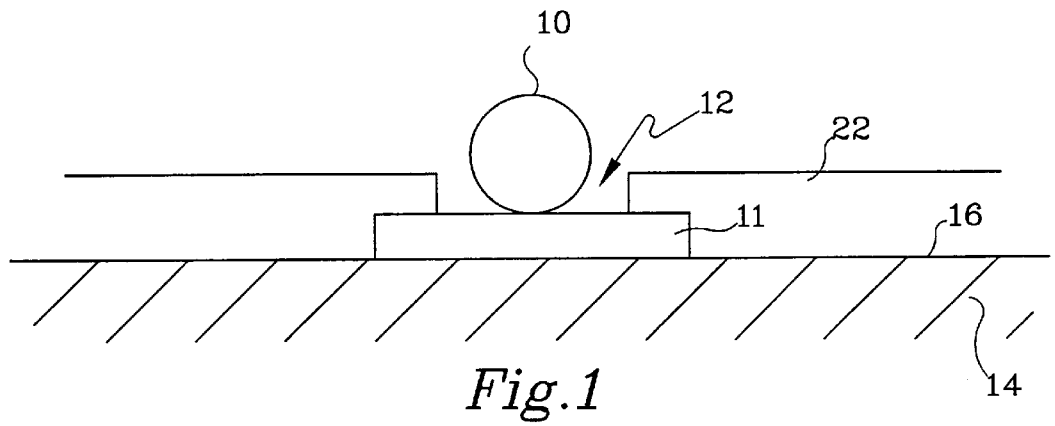
FIG. 1 is a cross section of a C4 solder ball on a conductor of a substrate.
Figure 2:
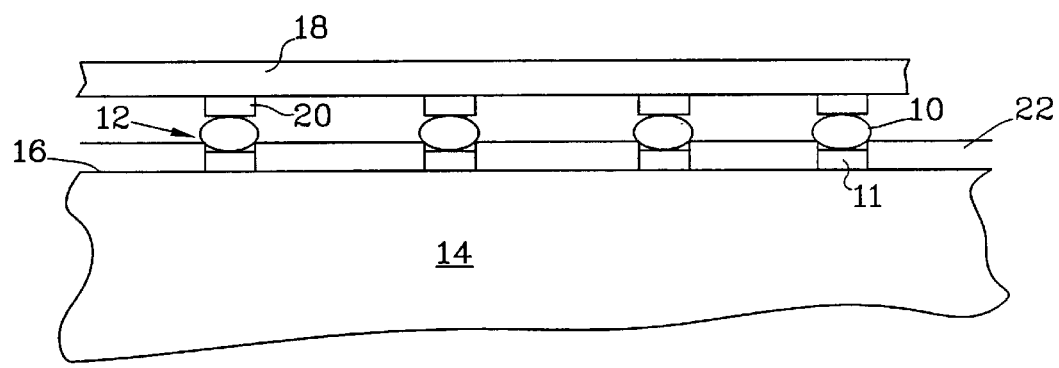
FIG. 2 shows a C4 solder mounting of a flip chip on a substrate.
Figure 3:
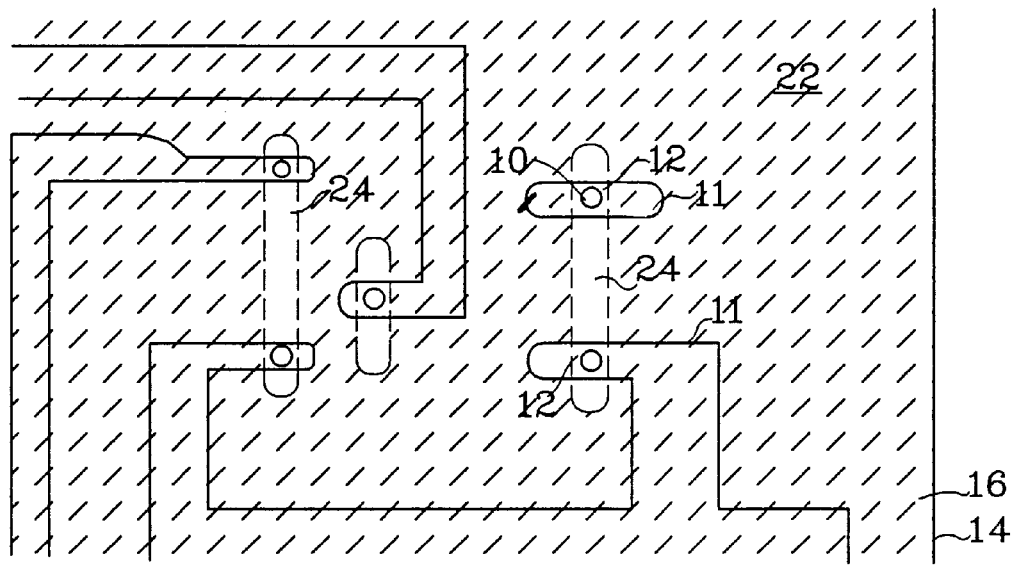
FIG. 3 shows the related art C4 solder pad design.

The following lists the diffusion patterning steps for C4 bump pads 12. Starting with a 96 percent Alumina ceramic substrate 14, a palladium silver conductor 11 is screen printed, dried, and fired. A DUPONT 6474 Pd/Ag conductor 11 is preferred, but any silver based conductor can be used. Conductor 11 is a paste that is screen printed on ceramic substrate 14. Paste 11 is dried at 150 degrees C. for 10 minutes and fired at 850 degrees for 10 minutes using a standard 30 minute furnace profile. In the previous process, the width of the printed line 11 in the area of C4 bump pads 12 had to be monitored and controlled between 8 and 11 mils (200 and 280 microns). The new process does not have this requirement, so conductor lines 11 may and are generally designed and printed wider than necessary. This allows for variations in alignment without adversely affecting the reliability of the resultant product.

Figure 4:
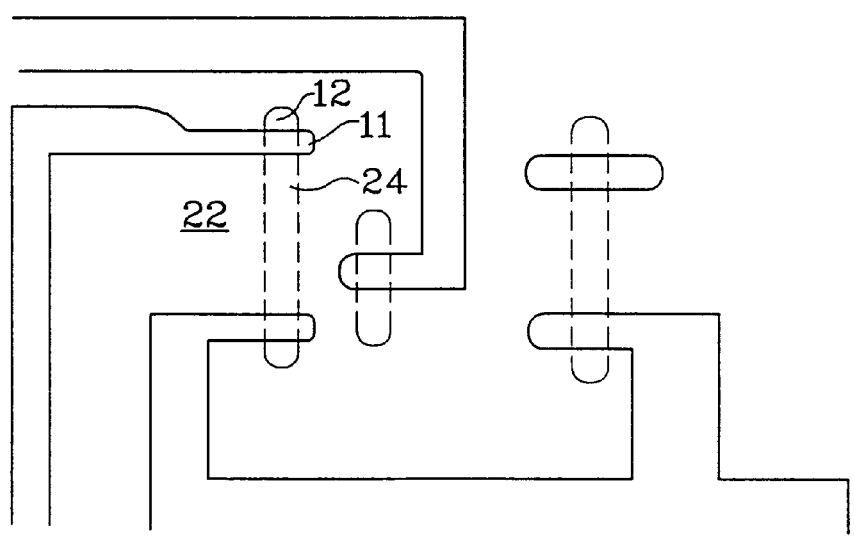
FIG. 4 reveals the conductor and encapsulant components for the C4 solder pads.

The next step is to apply an overglaze material 22 (or encapsulant). The previous process, as noted in FIG. 4, consisted of printing DUPONT 9137 encapsulant 22 over the conductor material 11. An opening, or window 24, was created in the pattern to create a C4 bump solder pad 12 using the conductor lines that were previously printed. Window opening 24 in encapsulant 22 was monitored and controlled between 8 and 11 mils (200 and 280 microns). When the part was finished, the conductor line 11 width in combination with the encapsulant window opening 24 had to result in a square C4 bump pad 12 with dimensions between the 8 and 11 mils (200 and 280 microns) in order to be a satisfactory result.

Figure 5A:
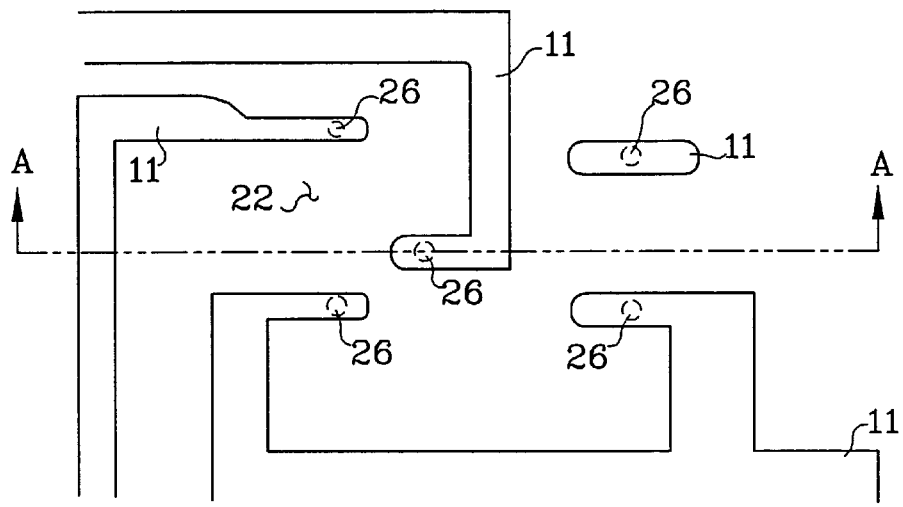
FIGS. 5A, 5B, 5C, 5D, 5E and 5F indicate the diffusion patterning, washing out and insertion of solder bumps for the C4 solder pads to connect with a flip chip.
Figure 5B:
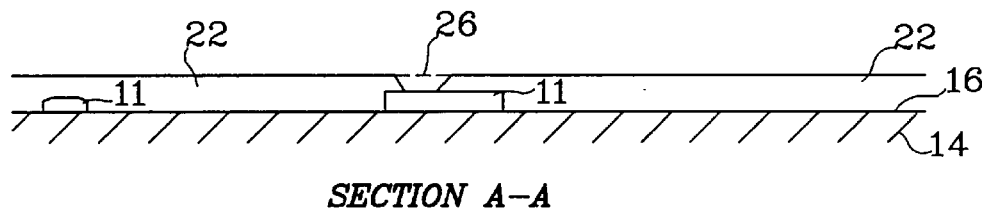
Figure 5C:
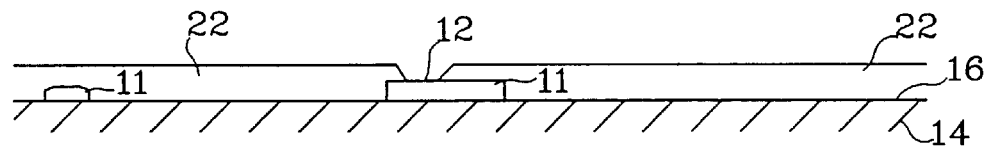
Figure 5D:
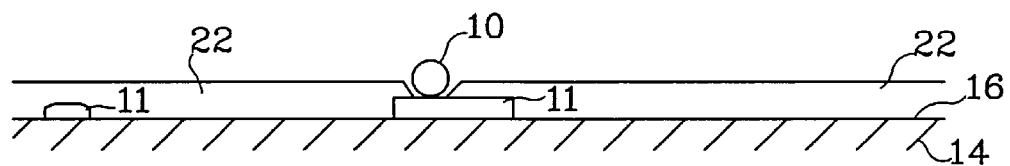
Figure 5E:
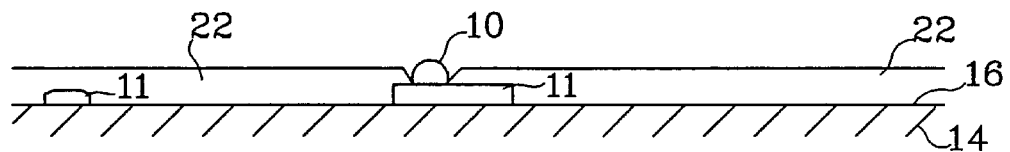
Figure 5F:
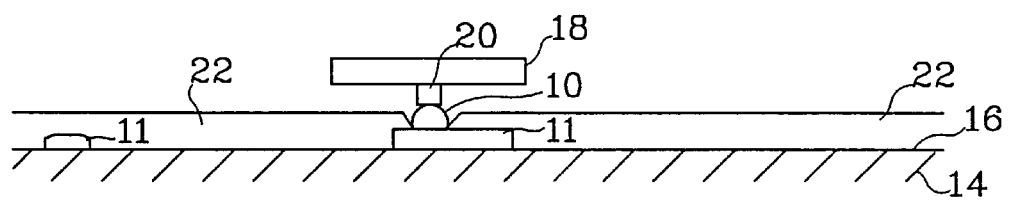

The new process involves an experimental DUPONT encapsulant 22 (E89384-51) that is applied as a continuous layer over the conductor 11 pattern, and then dried at 150 degrees Centigrade for 10 minutes. Next, DUPONT Q95IP is screen-printed on dried encapsulant 22. The pattern that is applied resembles a series of round dots of material 26, as shown in FIGS. 5A and 5B. The locations of these dots match the locations of the solder bumps on the corresponding flip chip. The next step is to diffuse the Q95IP into the encapsulant 22 with a dryer according to a developed drying time verses temperature curve or table to obtain a particular diameter of the hole for pad 12. In the present case, one heats the diffusing mixture for 8 minutes at 85 degrees Centigrade (C.). Once the material has diffused, the areas of round deposits 26 of Q95IP are soluble in water. A washout process, with water, is used to rinse away image 26 that was created with the Q95IP. The pattern that is left behind is a hole in th e encapsulant that is preferably from 8 to 11 mils (200 and 280 microns) in diameter which is located over a conductor line 11 or pad 12, as shown in FIG. 5C. The next step is to fire the encapsulant at 525 degrees C. for 30 seconds in a conveyor furnace. Since encapsulant 22 has a round hole, the conductor 11 or pad 12 material is no longer required to be strictly controlled to a specific width. Solder balls 10 may be placed in the holes on bump pads 12, as indicated by FIG. 5D, or may be reflowed on to the pads. The solder ball is heated just enough (above its molten temperature) to adhere to conductor 11 and become a bump 10, as shown in FIG. 5E. The solder has a composition of 10 percent tin, 88 percent lead and 2 percent silver. Solder bumps 10 are covered with flux. Terminals 20 of flip chip 18 may be brought into contact with solder bumps 10. Solder bumps 10 and terminals 20 are reflowed at 320 degree C. for 20 seconds so that the terminals are attached securely to the solder bumps, thereby resulting in the attachment of flip chip 18 to substrate 14, as revealed in FIG. 5F. Solder balls 10 typically are heated or reflowed into bumps on pads 12 of conductive material 11 prior to the attachment of flip chip 18.

The old process required both conductor lines 11 and encapsulant windows 24 to be monitored for attaining specific dimensions. If these dimensions were exceeded, solder could result in a short circuit of a conductor 11 or pad 12 to the edge of flip chip 18 placed on pads 12. The new process only requires encapsulant 22 be monitored since just a round hole is created for each of C4 bump pads 12.

While the invention has been described in terms of two exemplary embodiments, it is contemplated that it may be practiced as outlined above with modifications within the spirit and scope of the appended claims.

We claim:

1. A C4 bump pad process comprising:
   situating at least one conductor strip on a substrate surface;
   laying down an encapsulant on the at least one conductor strip and the substrate surface;
   applying an imaging paste on the encapsulant situated over a portion of the at least one conductor strip to define a bump pad area;
   drying the imaging paste, wherein the imaging paste diffuses into the encapsulant resulting in a paste-diffused encapsulant; and
   washing out the paste-diffused encapsulant from the substrate, which results in an opening through the encapsulant to the at least one conductor strip, resulting in a bump pad formed on the at least one conductor strip.

2. The bump pad process of claim 1, wherein:
   the substrate is ceramic;
   the at least one conductor strip is partially composed of silver; and
   the encapsulant is a glass.

3. The bump pad process of claim 2, wherein the bump pad has a linear dimension from 5 to 15 mils (125 to 380 microns).

4. The bump pad process of claim 2, wherein the at least one conductor strip is made from a Pd/Ag material.

5. The bump pad process of claim 4, wherein a solder ball is placed on the bump pad.

6. A C4 bump pad process comprising:
   screen printing a conductor on a substrate;
   applying an overglaze material on the conductor and substrate;
   screen printing an imaging paste delineating an area for a bump pad over the conductor on the overglaze material;
   diffusing the imaging paste into the overglaze material; and
   washing out the diffuse imaging paste and overglaze material, resulting in a hole through the overglaze material to make a bump pad on the conductor.

7. The bump pad process of claim 6, wherein said substrate comprises beryllium oxide.

8. The bump pad process of claim 6, further comprising placing a solder ball in the hole on the bump pad.

9. The bump pad process of claim 8, wherein:
   the substrate is ceramic;
   the conductor is partially composed of silver; and
   the overglaze material is a glass.

10. The bump pad process of claim 9, wherein the hole has a linear dimension from 5 to 15 mils (125 to 380 microns).

11. The bump pad process of claim 8, wherein the solder ball is partially melted so as to take the shape of a bump on the bump pad.

12. The bump pad process of claim 11, further comprising:
    attaching a terminal of a flip chip to the solder ball; and
    heating the solder ball and the terminal of the flip chip to the extent that the terminal attaches to the solder ball.

13. A C4 bump pad process comprising:
    putting an encapsulant layer on a substrate having conductive areas;
    designating bump pad areas on the conductive areas by applying an imaging paste on the encapsulant layer;
    heating the imaging paste so that the imaging paste diffuses into the encapsulant resulting in a water-soluble paste-diffused encapsulant; and
    washing out the paste-diffused encapsulant over the bump pad areas, resulting in openings through the encapsulant to construct the bump pads on the conductive areas.

14. The bump pad process of claim 13, further comprising placing a solder ball on each of the bump pads.

15. The bump pad process of claim 14, further comprising:
    situating terminals of a flip chip on the solder balls; and
    heating the solder balls to the extent that the solder balls attach to the terminals of the flip chip and to the bump pads on the conductive areas.

16. The bump pad process of claim 15, wherein the bump pad has a linear dimension between 5 and 15 mils (i.e., 125 and 380 microns).

17. The bump pad process of claim 16, wherein the conductive areas comprise some silver.

18. The bump pad process of claim 17, wherein the encapsulant is a glass.

19. The bump pad process of claim 18, wherein the substrate is a ceramic.

* * * * *